(12) United States Patent
Kirkpatrick et al.

(10) Patent No.: US 7,018,925 B2
(45) Date of Patent: Mar. 28, 2006

(54) POST HIGH VOLTAGE GATE OXIDE PATTERN HIGH-VACUUM OUTGAS SURFACE TREATMENT

(75) Inventors: Brian K. Kirkpatrick, Allen, TX (US); Rajesh Khamankar, Coppell, TX (US); Malcolm J. Bevan, Dallas, TX (US); April Gurba, Plano, TX (US); Husam N. Alshareef, Murphy, TX (US); Clinton L. Montgomery, Copell, TX (US); Mark H. Somervell, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 43 days.

(21) Appl. No.: 10/752,885

(22) Filed: Jan. 6, 2004

(65) Prior Publication Data
US 2004/0266113 A1    Dec. 30, 2004

Related U.S. Application Data

(60) Provisional application No. 60/438,112, filed on Jan. 6, 2003.

(51) Int. Cl.
*H01L 21/302* (2006.01)

(52) U.S. Cl. .................. 438/689; 438/725; 438/687

(58) Field of Classification Search ........... 438/689, 438/725, 687, 680, 638, 670
See application file for complete search history.

(56) References Cited

U.S. PATENT DOCUMENTS

| 6,100,185 | A * | 8/2000 | Hu ...................... 438/642 |
| 6,143,608 | A * | 11/2000 | He et al. .................. 438/264 |
| 6,191,086 | B1 * | 2/2001 | Leon et al. ................ 510/175 |
| 6,204,192 | B1 * | 3/2001 | Zhao et al. ............... 438/723 |
| 2004/0043567 | A1 * | 3/2004 | Krishnan et al. ........... 438/275 |
| 2004/0142570 | A1 * | 7/2004 | Kirkpatrick et al. ........ 438/689 |
| 2004/0235203 | A1 * | 11/2004 | Gurba et al. ................. 438/8 |
| 2004/0262701 | A1 * | 12/2004 | Alshareef et al. ........... 257/410 |
| 2004/0266113 | A1 * | 12/2004 | Kirkpatrick et al. ........ 438/275 |

* cited by examiner

*Primary Examiner*—Laura M. Schillinger
(74) *Attorney, Agent, or Firm*—Peter K. McLarty; W. James Brady, III; Frederick J. Telecky, Jr.

(57) ABSTRACT

The present invention provides a method for fabricating a dual gate semiconductor device. In one aspect, the method comprises forming a nitridated, high voltage gate dielectric layer over a semiconductor substrate, patterning a photoresist over the nitridated, high voltage gate dielectric layer to expose the nitridated, high voltage dielectric within a low voltage region, wherein the patterning leaves an accelerant residue on the exposed nitridated, high voltage gate dielectric layer, and subjecting the exposed nitridated, high voltage dielectric to a high vacuum to remove the accelerant residue.

11 Claims, 10 Drawing Sheets

| Split | Wfr | Mean Thick (Å) | Normalized Delta from Target | Stdev | %Stdev | Range | Split |
|---|---|---|---|---|---|---|---|
| 1 | 1 | 11.42 | 0.42 | 0.60 | 5.29 | 1.98 | D-PN, No HVGX Pattern, With BHF |
|   | 2 | 10.48 | -0.52 | 0.76 | 7.27 | 2.34 |   |
|   | 3 | 10.55 | -0.45 | 0.68 | 6.48 | 2.14 |   |
| 2 | 4 | 19.73 | 0.73 | 2.55 | 12.91 | 7.57 | D-PN, HVGX Pattern, No BHF |
|   | 5 | 19.37 | 0.37 | 1.13 | 5.81 | 3.28 |   |
|   | 6 | 18.85 | -0.15 | 1.37 | 7.27 | 4.05 |   |
| 3 | 7 | 11.88 | 0.88 | 0.39 | 3.27 | 1.24 | D-PN, HVGX Pattern, Plasma Treatment 1, BHF |
|   | 8 | 11.45 | 0.45 | 0.41 | 3.56 | 1.27 |   |
|   | 9 | 10.17 | -0.83 | 0.30 | 2.96 | 0.79 |   |
| 4 | 10 | 11.68 | 0.68 | 0.47 | 4.02 | 1.45 | D-PN, HVGX Pattern, Plasma Treatment 2, BHF |
|   | 11 | 11.70 | 0.70 | 0.35 | 2.95 | 1.11 |   |
|   | 12 | 10.22 | -0.78 | 0.52 | 5.09 | 1.56 |   |
| 5 | 13 | 20.04 | 9.04 | 0.74 | 3.69 | 1.90 | D-PN, HVGX Pattern, Treatment 1 w/o Plasma, BHF |
|   | 14 | 19.90 | 8.90 | 1.03 | 5.19 | 3.40 |   |
|   | 15 | 17.97 | 6.97 | 2.03 | 11.32 | 7.11 |   |
| 6 | 16 | 20.44 | 9.44 | 1.46 | 7.16 | 4.98 | D-PN, HVGX Pattern, Treatment 2 w/o Plasma, BHF |
|   | 17 | 20.20 | 9.20 | 0.93 | 4.61 | 2.92 |   |
|   | 18 | 20.75 | 9.75 | 2.34 | 11.26 | 7.96 |   |
| 7 | 19 | 16.68 | 5.68 | 1.24 | 7.43 | 3.83 | D-PN, HVGX Pattern, Treatment 3 w/o Plasma, BHF |
|   | 20 | 14.79 | 3.79 | 1.35 | 9.14 | 3.82 |   |
|   | 21 | 11.19 | 0.19 | 1.22 | 10.87 | 3.05 |   |
| 8 | 22 | 10.01 | 0.25 | 0.22 | 2.19 | 0.68 | No D-PN, HVGX Pattern, BHF |
|   | 23 | 10.11 | 0.15 | 0.22 | 2.20 | 0.61 |   |
|   | 24 | 10.68 | -0.42 | 0.18 | 1.66 | 0.48 |   |

FIGURE 2

POST HIGH VOLTAGE GATE OXIDE PATTERN HIGH-VACUUM OUTGAS SURFACE TREATMENT

CROSS-REFERENCE TO PROVISIONAL APPLICATION

This application claims the benefit of U.S. Provisional Application Ser. No. 60/438,112 entitled "POST HIGH VOLTAGE GATE OXIDE PATTERN HIGH-VACUUM OUTGAS SURFACE TREATMENT," to Kirkpatrick, et al., filed on Jan. 6, 2003, which is commonly assigned with the present invention and incorporated herein by reference as if reproduced herein in its entirety.

TECHNICAL FIELD OF THE INVENTION

The present invention is directed, in general, to a method for manufacturing a dual gate integrated circuit and, more specifically, to a method for improving the surface uniformity over a low voltage area using a post high voltage gate dielectric pattern high-vacuum outgas surface treatment that is conducted subsequent to nitridation of a high voltage gate dielectric.

BACKGROUND OF THE INVENTION

Dual gate integrated circuits having both high voltage (HV) devices, which may also be referred to herein as input/output (I/O) devices, and low voltage (LV), or core, devices have gained wide acceptance and utility in the semiconductor industry since their introduction. In addition, however, there is a great demand for shrinking these semiconductor devices to provide an increased device density on the semiconductor chip and provide chips that are faster and consume less power. In fact, to provide the required device performance, the scaling of the gate dielectric thickness in these devices has now reached below 2.5 nm.

However, simply scaling standard dielectrics while maintaining good process control in this thickness regime is very difficult. Thus, the industry is left with the desire to use thicker films that are correspondingly easier to control to tight limits, while using the existing equipment, and decreasing the electrical dielectric thickness to increase device performance (increase $I_{DS}$) with less leakage and without degradation to long channel threshold voltages.

To achieve these goals, the industry has turned to the use of high dielectric constant (high-k) materials. One such high-k film that has found popular utility is a plasma nitridated oxide or PNO. In this process, a remote or decoupled nitrogen plasma or other known method for nitridation is used to implant a dielectric with uniformly high doses of nitrogen. The addition of this nitrogen effectively increases the dielectric constant value of the gate dielectric, thus allowing a physically thicker film to be electrically thinner.

Initially, these plasma nitridation processes were used for the LV device due to the fact that its gate dielectric thickness was thinner than the gate dielectric of the HV device. Thus, a high-k material for the HV devices was not required because the overall scale of the integrated circuit had not reached the point that required the use of such a material in the I/O area. As such, plasma nitridation was not used on the high voltage area, but with the advent of less than 2.5 nm HV devices, nitridation of the HV region is now highly desirable for a fully robust device.

Unfortunately, however, the industry has been experiencing problems when both the HV gate dielectric and LV gate dielectric are nitridated. More specifically, the industry has begun to notice a roughing of the underlying base silicon in the LV device area. FIG. 1 is a transmission electron microscope (TEM) photo of a silicon surface 10 wherein the LV layer 15 was formed using a dual plasma nitridation process in which both the HV gate dielectric and the LV gate dielectric were nitridated. As seen in this figure, the silicon surface 10 is irregular or roughened at 10a. Layer 17 is a poly gate electrode subsequently formed on top of the previously roughened LV dielectric. This condition is highly undesirable because roughened silicon has several disadvantages, including lower intrinsic reliability, additional variation in the optical thickness measurements used for inline process control, and increase variation in ramped voltage breakdown metrics.

Accordingly, what is needed in the art is a method of manufacturing an integrated circuit that does not produce a roughened silicon surface when subjected to a dual plasma nitridation process.

SUMMARY OF THE INVENTION

To address the above-discussed deficiencies of the prior art, the present invention provides a method for fabricating a dual gate semiconductor device. In one embodiment, the method comprises forming a nitridated, high voltage gate dielectric layer over a semiconductor substrate, patterning a photoresist over the nitridated, high voltage gate dielectric layer to expose the nitridated, high voltage dielectric within a low voltage region, wherein the patterning leaves an accelerant residue on the exposed nitridated, high voltage gate dielectric layer, and subjecting the exposed nitridated, high voltage dielectric to a high vacuum to remove the accelerant residue.

In another embodiment, the present invention provides a method for manufacturing a dual gate integrated circuit. In this embodiment, the method includes forming a nitridated, high voltage gate dielectric layer over a semiconductor substrate, patterning a photoresist over the nitridated, high voltage gate dielectric layer to expose the nitridated, high voltage dielectric within a low voltage region, the patterning leaving an accelerant residue on the exposed nitridated, high voltage gate dielectric layer, and subjecting the exposed nitridated, high voltage dielectric to a high vacuum to remove the accelerant residue.

This embodiment, however, further includes forming a nitridated, low voltage gate dielectric layer over the semiconductor substrate within the low voltage regions, forming high voltage gate transistors over the nitridated, high voltage gate dielectric layer. It further includes forming low voltage gate transistors over the nitridated, low voltage gate dielectric layer, forming source/drain regions associated with each of the high voltage and low voltage transistors, forming dielectric layers located over the high voltage and low voltage transistors, and forming interconnects extending through the dielectric layers to interconnect the high voltage and low voltage transistors to form an operative integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which:

FIG. 2 illustrates a table that further presents data that indicates the presence of the accelerant residue and its effect on the measured thickness of the LV gate dielectric and the benefits of its removal by the process covered by the present invention;

DETAILED DESCRIPTION

Figure 1:
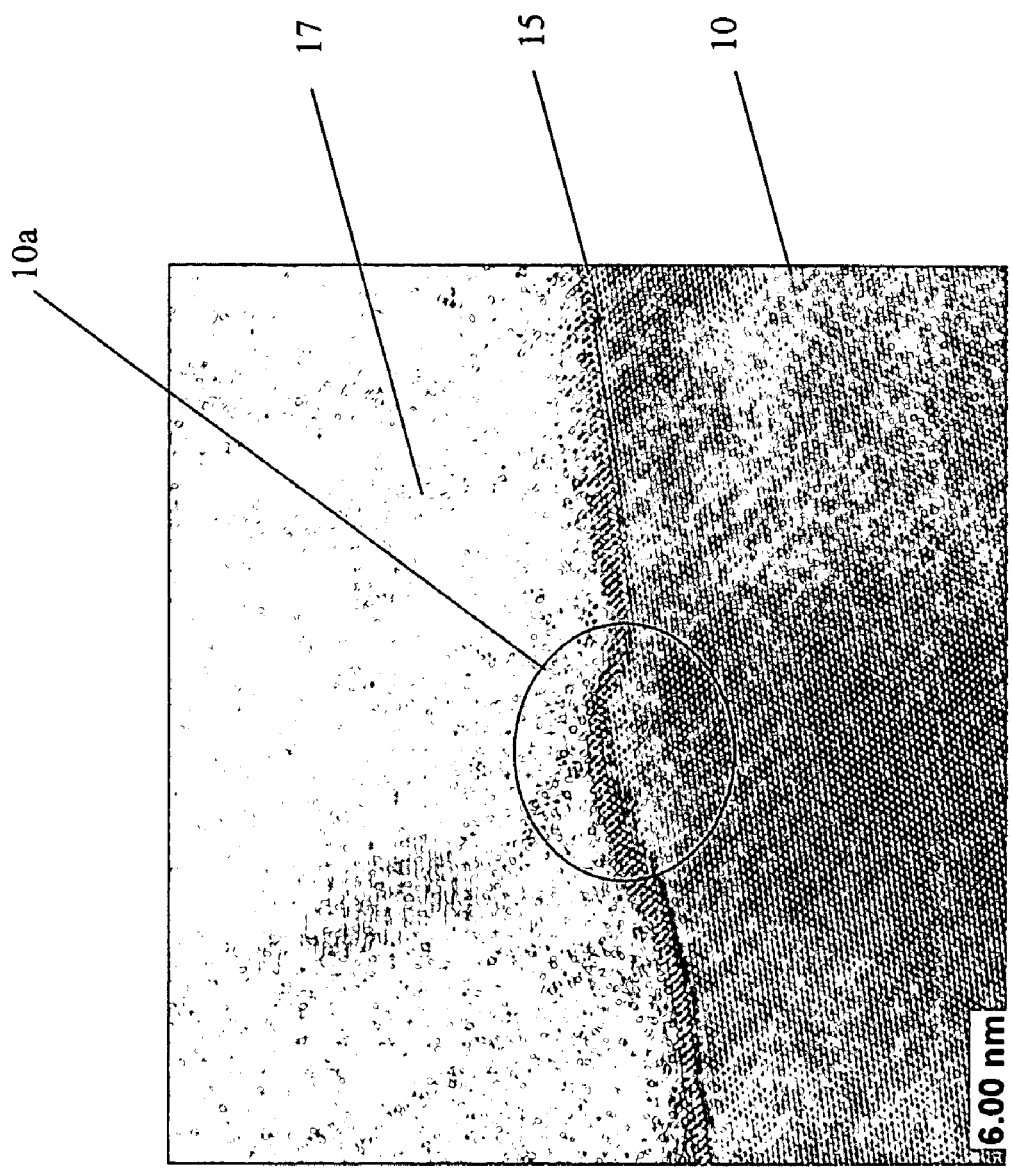
FIG. 1 illustrates a TEM photo of a roughened silicon surface of a device fabricated in accordance with conventional processing techniques.

The present invention uniquely recognizes that a nitridation of a HV dielectric layer and subsequent patterning of a photoresist over a LV region leaves an accelerant residue that, based on observations, effectively increases or enhances the etch rate of a wet etchant such that the etchant significantly etches into the silicon substrate lying under the accelerant residue. It has presently been found that when the wet etch is conducted on an exposed nitridated, HV gate dielectric layer in the LV region, the accelerant residue, if not removed, enhances the etching rate of the etchant such that it etches into the silicon and roughens the silicon surface at a rate greater than it normally would if the accelerant residue were not present.

As a result, wherever the accelerant residue is present on the nitridated, HV gate dielectric, it has been observed that the silicon is removed at a much greater rate than in those areas where the accelerant residue is not present. This results in a roughened or bumpy silicon surface, which is undesirable for the reasons stated in the Background. In contrast, in those areas where the accelerant residue is not present, the silicon surface is not roughened to the extent beyond desired design parameters.

It should be specifically understood that this accelerant residue is not a "photoresist scum" in the conventional sense. Indeed, it essentially functions like a reverse scum or anti-scum. In a conventional scumming situation, when a photoresist scum covers a portion of a surface, such as a dielectric, it protects that surface from the etchant, which leaves the underlying surface essentially unaffected, except for any undercut etching that might occur. This is in stark contrast to the accelerant residue recognized by the present invention in that the accelerant residue does not protect the area that it covers. To the contrary, it increases the etch rate of the wet etchant such that it significantly etches into the underlying silicon substrate. In addition, conventional scum can be detected with a scanning electron microscope (SEM), whereas the accelerant residue is not detectable by a SEM or any similar qualitative tool presently available.

In the process of discovering the presence of the accelerant residue, deglaze tests were conducted on a dual nitridated gate device. HV gate dielectric layers were grown over the subject wafers and nitridated using a plasma nitridation process wherein nitrogen is introduced into the plasma environment. Following nitridation of the HV gate dielectric layers, a photoresist was deposited and patterned to expose the HV gate dielectric layers located over the LV regions. Prior to exposing the HV gate dielectric layer to an etchant, the wafers were placed in an inline scanning electron microscope (SEM) and vacuumed to about 1 $e^{-6}$ torr for about 20 minutes. After this, the exposed HV gate dielectric layers were then conventionally removed with an etchant, and a LV gate dielectric layer was then grown in the exposed areas and nitridated with a plasma nitridation process. It was recognized that the high vacuum step had a positive affect on the measured thickness of the LV gate dielectric, as measured by an ellipsometer, in that the thickness ranged between about 0.9 nm and about 1.2 nm, even when exposed to the deglaze etching process for as much as 120 seconds.

While the chemical composition of the accelerant residue or the chemical reactions with the etchant and silicon substrate are not presently known, it should be understood that the present invention recognizes the presence of the accelerant residue and presents a unique method for removing it. However, given the chemical composition of the photoresist and the fact that nitridation of the HV gate dielectric causes roughening of the silicon substrate, it is theorized that the accelerant residue may be a chemical interaction between the wet etch, photoresist residue, and nitrogen present in the underlying dielectric and/or silicon substrate.

FIG. 2 is a table that further presents data that indicates the presence of the accelerant residue and its affect on the measured thickness of the LV gate dielectric and the benefits of its removal by the process covered by the present invention. FIG. 2 is a table of ellipsometric measurements taken of the LV gate dielectrics located on different wafers and fabricated with different processing steps or conditions.

In Split 1, which covered wafers 1 through 3, the LV gate dielectrics were fabricated using a plasma nitridation process on the HV gate dielectrics, but no photoresist was used to mask off the HV gate dielectrics. BHF was used to remove the HV gate dielectrics over the LV regions. As seen from FIG. 2, this process yielded LV gate dielectrics having a mean thickness ranging from about 1.048 nm to about 1.142 nm, which is a desirable target thickness range. The same desirable thickness range was found using split 8 covering wafers 22 through 24, where no nitridation process was used on the HV gate dielectric layers, photoresist was used to pattern the LV gate regions. BHF was used to remove the HV gate dielectrics over the LV regions. As seen from FIG. 2, this process also yielded LV gate dielectrics having a desirable range (about 1.001 to about 1.068 nm) suggesting minimum to no silicon roughening.

Taking into account the change in desirable thickness range one would expect if the BHF is left off, split 2 covering wafers 4 through 6 shows the effect of nitridating the HV gate dielectric layers, using photoresist to pattern the LV regions and then not using BHF to remove the HV gate dielectric over the LV regions. In this case, thickness values from about 1.885 to about 1.973 nm was a desirable outcome. The result of these three splits drove the conclusion that the presence of a previously nitridated dielectric and photoresist were part of an interaction with the BHF causing roughened silicon, since there was little affect on the mean thickness when any one of the three components was not present.

With continued reference to FIG. 2, in Split 3 and 4, which covers wafers 7 through 9 and 10 through 12, respectively, a plasma nitridation process was conducted as before, and the HV gate dielectrics were patterned with a photoresist. However prior to the BHF etching process, the wafers were subjected to a plasma treatment. This plasma treatment is disclosed in U.S. Provisional Application Ser. No. 60/438,111 filed on Jan. 6, 2003, and is discussed in detail in co-pending U.S. patent application, Ser. No. 10/752,882, filed on Jan. 6, 2004, both of which are fully incorporated herein by reference. As seen from this data, these wafers had LV gate dielectrics whose measured thickness ranged from about 1.017 nm to about 1.188 nm. Again, these acceptable target thickness ranges are in distinct contrast to those thickness obtained in Split 5 and 6, which covers wafers 13 through 15 and 16 through 18, respectively. However, the plasma treatment might not be applicable in all application, inasmuch as it has an impact on photoresist critical dimensions, and the use of this plasma treatment may become more problematic as device dimensions continue to shrink.

As seen from FIG. 2, all steps were the same as Split 3 and 4, except the plasma treatment of the present invention was omitted with undesirable results of LV gate dielectrics measured thicknesses. These larger thickness measurements indicated significant silicon roughening in the LV regions. In Split 7, which covers wafers 19 through 21, a plasma nitridation was conducted, but in place of the plasma treatment, the device was subjected to a high-vacuum step.

As further seen from FIG. 2, the high vacuum out gas significantly reduces the mean dielectric thickness back toward baseline levels. These results suggest that with optimized time and pressure, the residual photo-chemicals can be removed from the surface. In Split 8, which covers wafers 22 through 24, no plasma nitridation was conducted, which resulted in desirable LV gate dielectrics measured thicknesses and minimal to no silicon roughening. Given the need to have an HV and LV gate and increase the dielectric constant on both, omission of the photo pattern or the plasma nitridation process as was done in Split 1 and 8, respectively, are not a viable manufacturing choices.

Upon observing the measured thickness results of the wafers manufactured by processes not covered by the present invention and processes covered by the present invention, it was readily apparent that when a plasma nitridation process was used on the HV gate dielectric, a residue was being left after the photoresist was patterned. It was also apparent that this residue interacted with the etchant used to remove the HV gate dielectric and accelerated or enhanced the etching properties of the etchant, such that after removing the HV dielectric, it significantly etched into the underlying silicon surface and roughened it. With an explanation of how the residue was realized, the unique process used to remove it will now be discussed in detail.

Figure 3A:
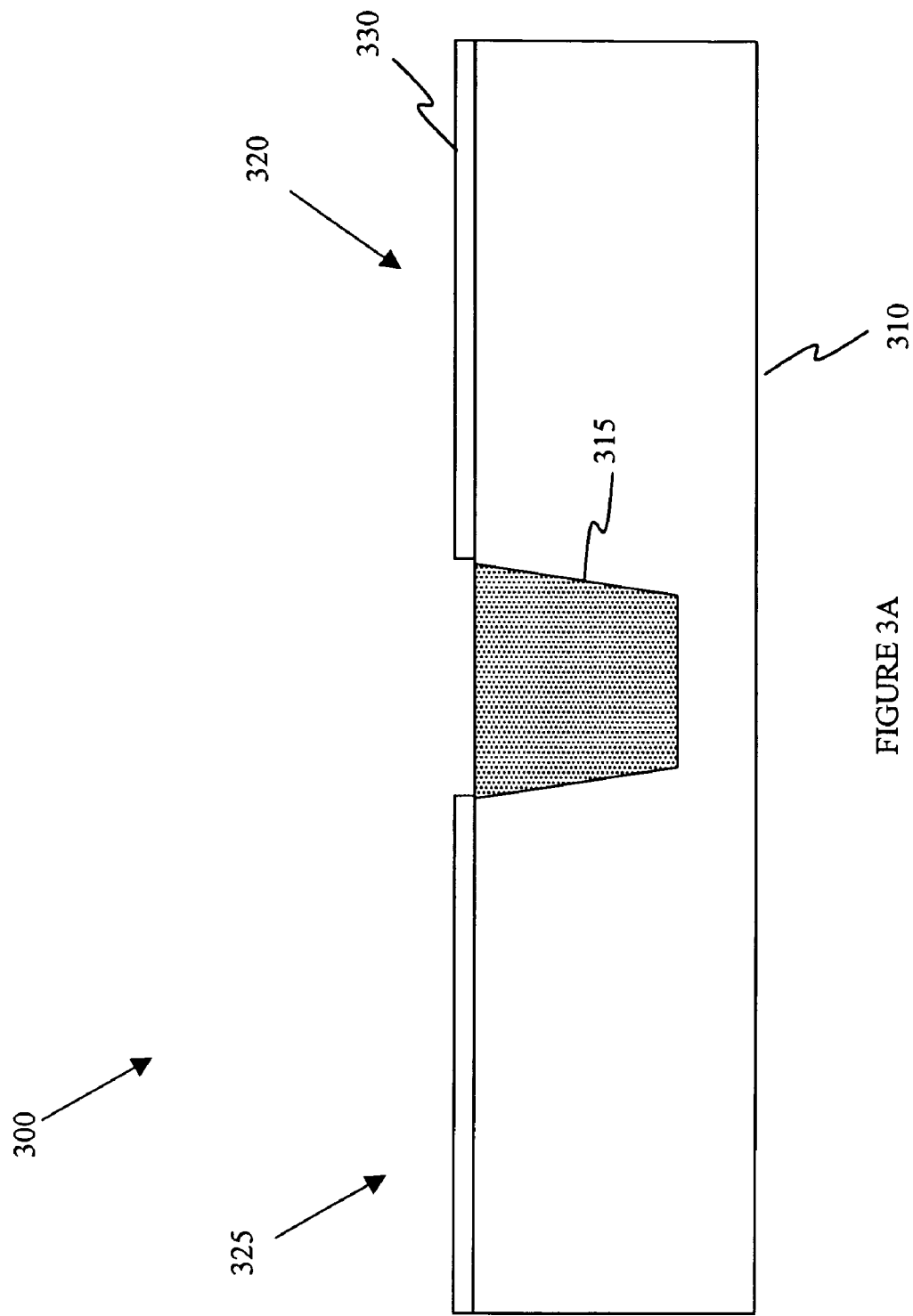
FIG. 3A illustrates a sectional view of a LV/HV device at an early stage of manufacture.

Turning initially to FIG. 3A, there is illustrated a sectional view of a LV/HV device 300 at an early stage of manufacture. In this particular view, there is illustrated a semiconductor substrate 310, such as a silicon substrate, having a conventional isolation structure 315 formed therein. For purposes of discussion here, the isolation structure 315 divides the semiconductor substrate 310 into a HV region 320 and a LV region 325. Also shown, is a HV gate dielectric layer 330 that has been conventionally grown over the semiconductor substrate 310, including the LV region 325.

Figure 3B:
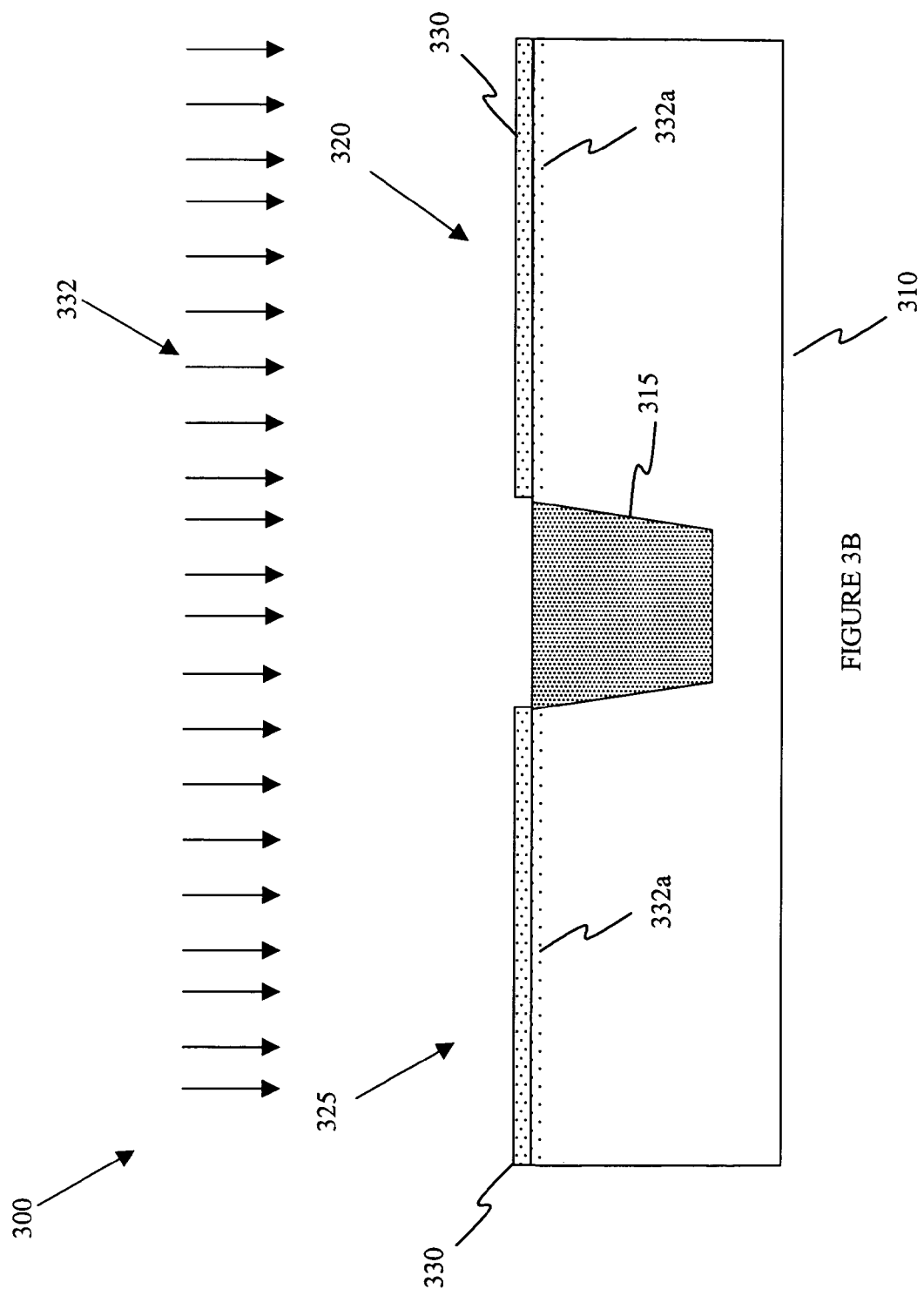
FIG. 3B illustrates sectional view of the LV/HV device of FIG. 3A following the formation of the HV gate dielectric layer as it is being subjected to a nitridation process.

Following the formation of the HV gate dielectric layer 330, it is subjected to a nitridation process 332, indicated by the arrows, as shown in FIG. 3B. In one embodiment, the nitridation process 332 may be a dual plasma nitridation process that employs a decoupled or remote plasma process. In such embodiments, the nitridation process includes a plasma nitridation process that employs a decoupled or remote plasma process. In such embodiments, the nitridation process includes the use of nitrogen radicals to incorporate nitrogen into the gate oxide layer. The nitrogen radicals are generated using nitrogen gas and an RF or microwave plasma source. Other gasses may also be present during the nitridation process. However, other nitridation processes, such as thermal nitridation using a vertical furnace or single-wafer reactor with N2, NO or N2O gasses might also be used. As seen from FIG. 3B, it should be noted that some of the nitrogen, which is shown as the lesser dense dots and designate 332a, is incorporated into the underlying silicon semiconductor substrate 310.

Figure 3C:
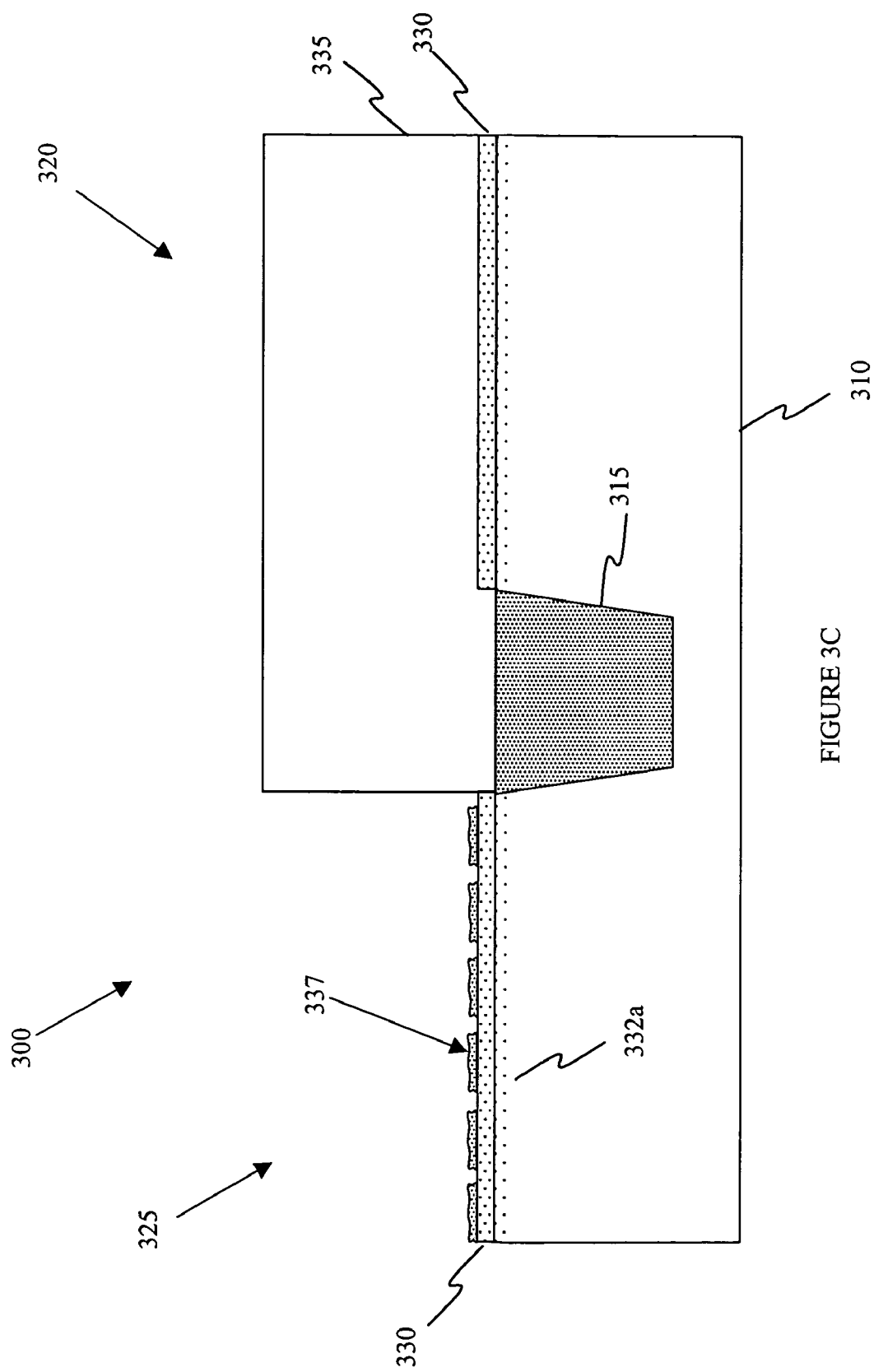
FIG. 3C illustrates a sectional view of the LV/HV device of FIG. 3B after the nitridation of the HV dielectric layer and conventional deposition and patterning of a photoresist that protects the HV region and exposes the LV region for removal of the HV dielectric layer over the LV region using a wet etch process.

Referring now to FIG. 3C, after the nitridation of the HV dielectric layer 330, a conventional photoresist 335 is deposited and patterned to protect the HV region 320 and expose the LV region 325 for removal of the HV dielectric layer 330 in the LV region 325 using a wet etch process. Based on observations discussed above, it has been found that during the photoresist patterning process, a residue 337 of the photoresist 335 is left on the exposed HV dielectric layer 330, as shown in FIG. 3C, and as also discussed above, this residue 337 accelerates or enhances the etching properties of the wet etch, and if not removed, it roughens the surface of the semiconductor substrate 310 by etching into the underlying silicon.

Figure 3D:
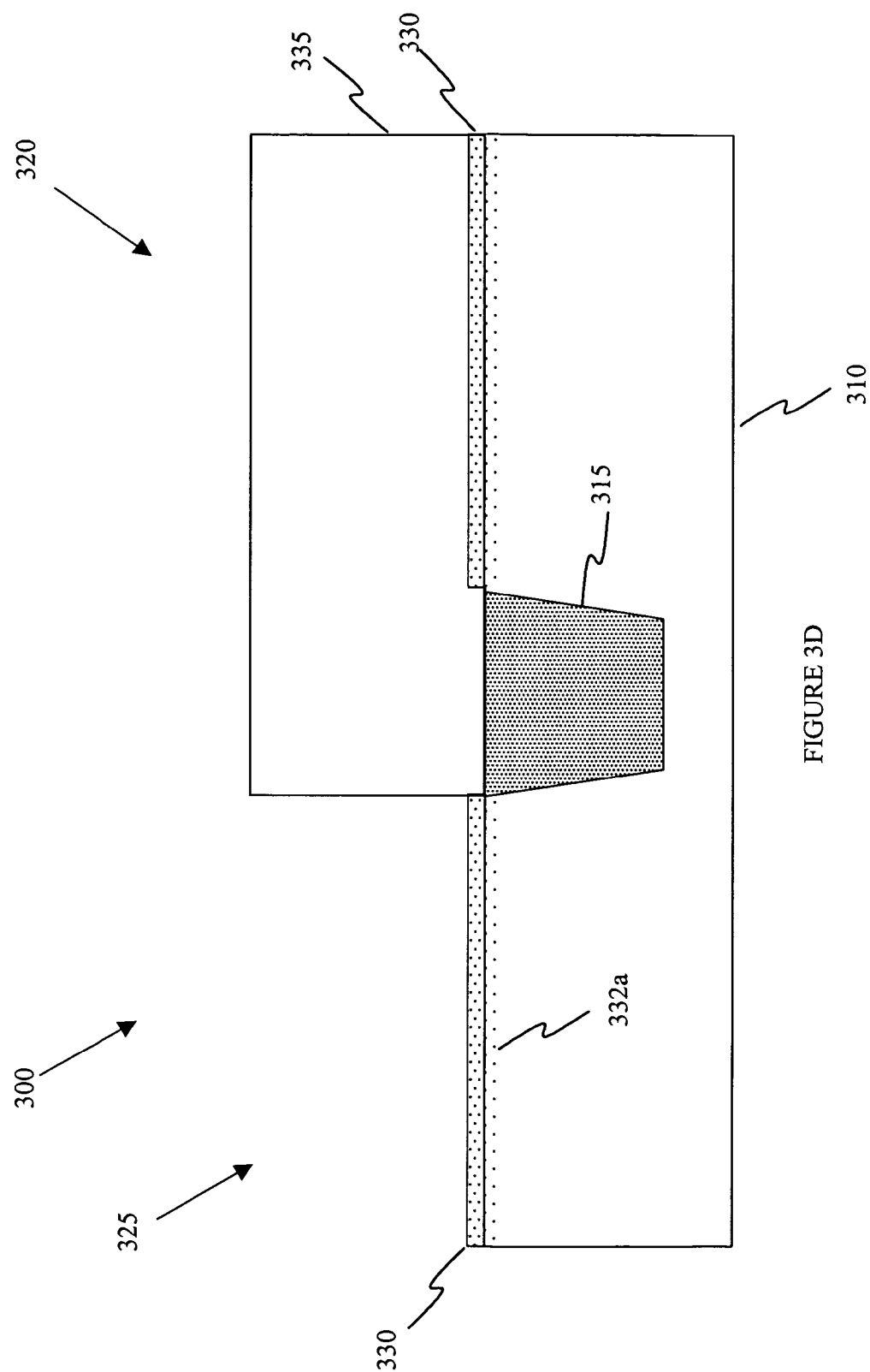
FIG. 3D illustrates a sectional view of the LV/HV device of FIG. 3C after the removal using a plasma process of the residue, which minimizes roughening of the substrate.

With reference now to FIG. 3D, the LV/HV device 300 is subjected to a high vacuum out gas surface treatment that effectively removes the residue 337, and which, in turn, minimizes roughening of the substrate 310 during a subsequent wet etch process. In one embodiment, the LV/HV device 300 is subjected to a high vacuum ranging from about $1\,e^{-3}$ torr to about $1\,e^{-8}$ torr. It should be understood that the lower range in pressure will depend on the tool being used. In a particularly advantageous embodiment, however, the vacuum is 1 $e^{-6}$ torr. Any vacuum tool that is capable of achieving a high vacuum may be used. For example, in one test, an inline scanning electron microscope (SEM) was used and in another, an ion implanter was used. The time during which the LV/HV device 300 is subjected to the high vacuum may vary. For example, in one embodiment, the time may range from about 2 minutes to about 60 minutes. However, in an advantageous embodiment, the exposure time is about 10 minutes. The temperature within the vacuum chamber may range from about 20° C. (i.e., room temperature) to about five degree less than the glass transition temperature ($T_g$) Of the photoresist used, with room temperature being preferred.

Figure 3E:
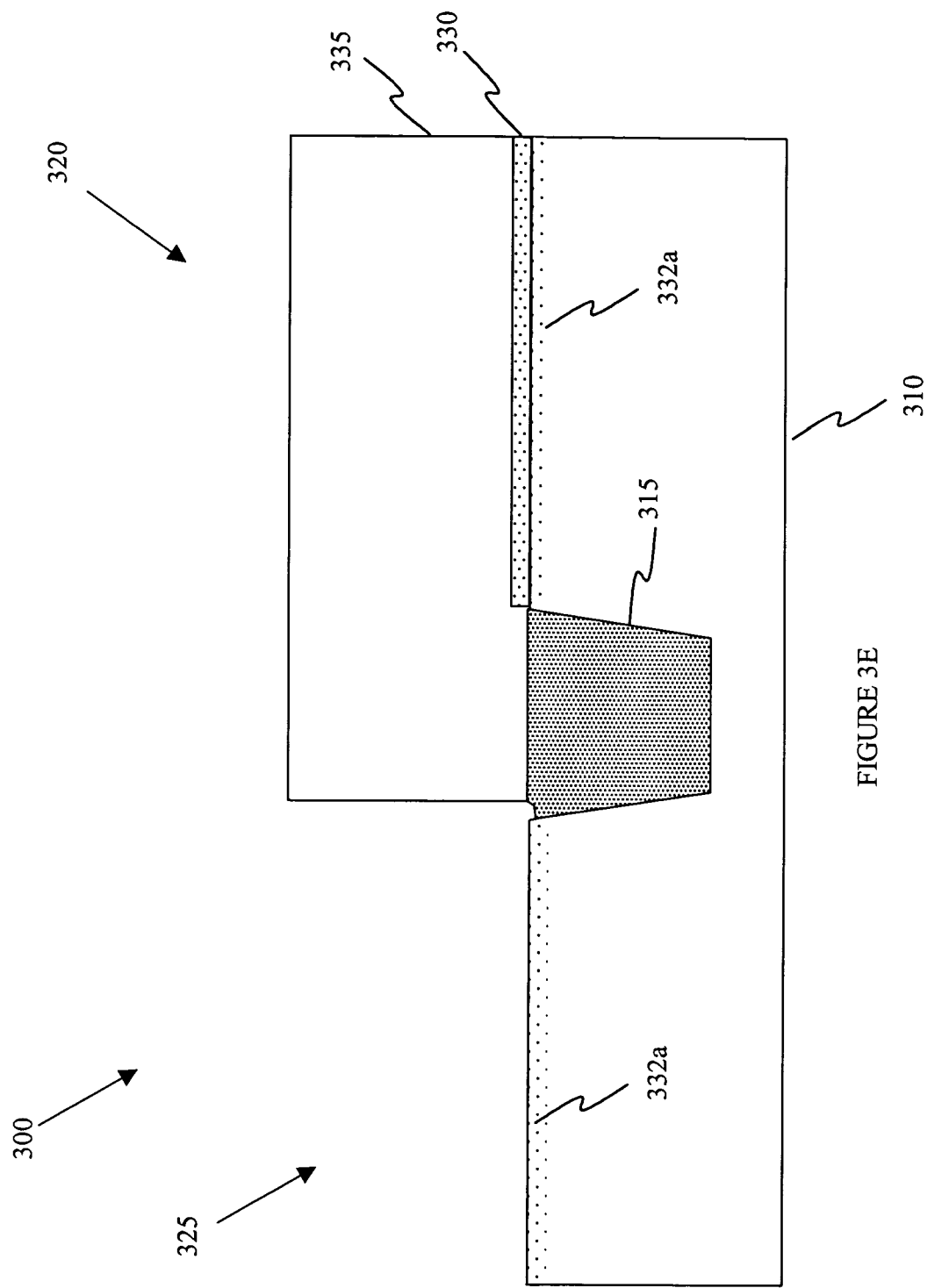
FIG. 3E illustrate a sectional view of the LV/HV device of FIG. 3D following the plasma treatment and conventional wet etch to remove the HV dielectric layer from the LV region 425.

Following the high vacuum treatment, a conventional wet etch is then conducted to remove the HV dielectric layer 330 from the LV region 325, which is illustrated in FIG. 3E. With the residue 337 either completely or substantially gone, a substantially smoother semiconductor substrate 310 can be achieved. In fact, samples fabricated using the present invention were analyzed with an atomic force microscope, which revealed that the samples subjected to the plasma treatment had root mean squared values ranging from about 0.2 nm to about 0.5 nm, and a goodness of fit between the semiconductor substrate and the nitridated low voltage gate dielectrics ranging from about 0.997 to about 0.999, both of which indicated minimal to no significant roughening of the semiconductor substrate 310. In one aspect of the present invention, the wet etch may comprise BHF. However, other etchants or etching components, such as HF, HF/H2O2, ozone sulfuric acid or hydrogen peroxide, might also be used either alone on in conjunction with the BHF.

Figure 3F:
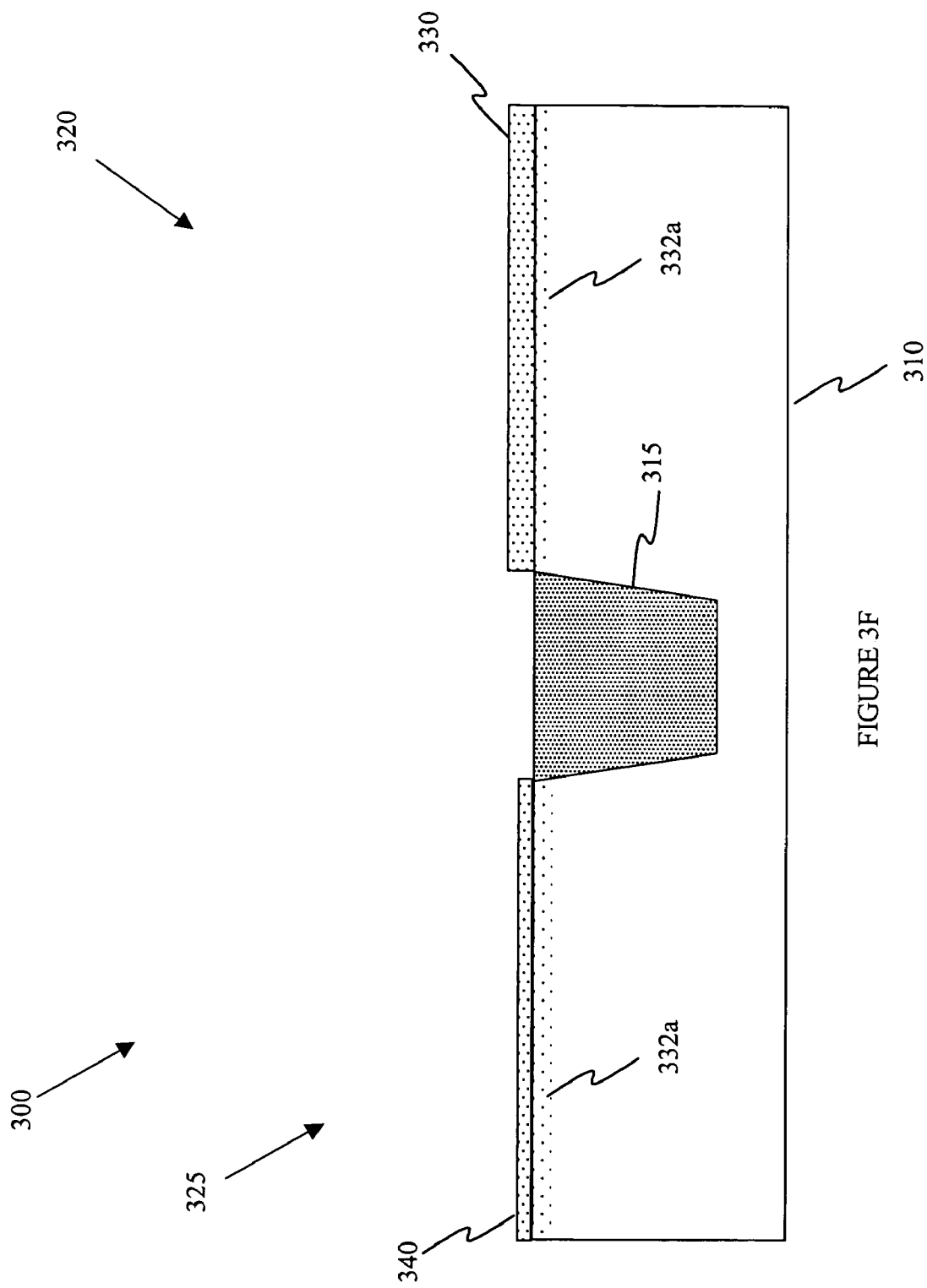
FIG. 3F illustrates a sectional view of the LV/HV device of FIG. 3E after photoresist is removed, and the LV Gate oxide is formed, and the wafer is left with a LV and HV gate dielectric.

Turning now to FIG. 3F, in a further aspect of the present invention, after the HV gate dielectric layer 330 is removed from the LV region 325, the photoresist 335 is removed from the HV region 320 and a LV gate dielectric 340 is conventionally grown in the LV region. The LV gate dielectric 340 may then be subjected to a nitridation process to nitridate the LV gate dielectric 340 and thereby increase its dielectric constant. It should be noted that the HV gate dielectric 330 is subjected to both the growing process, which increases its thickness, and to the nitridation, which double nitridates the HV gate dielectric 330.

Figure 4:
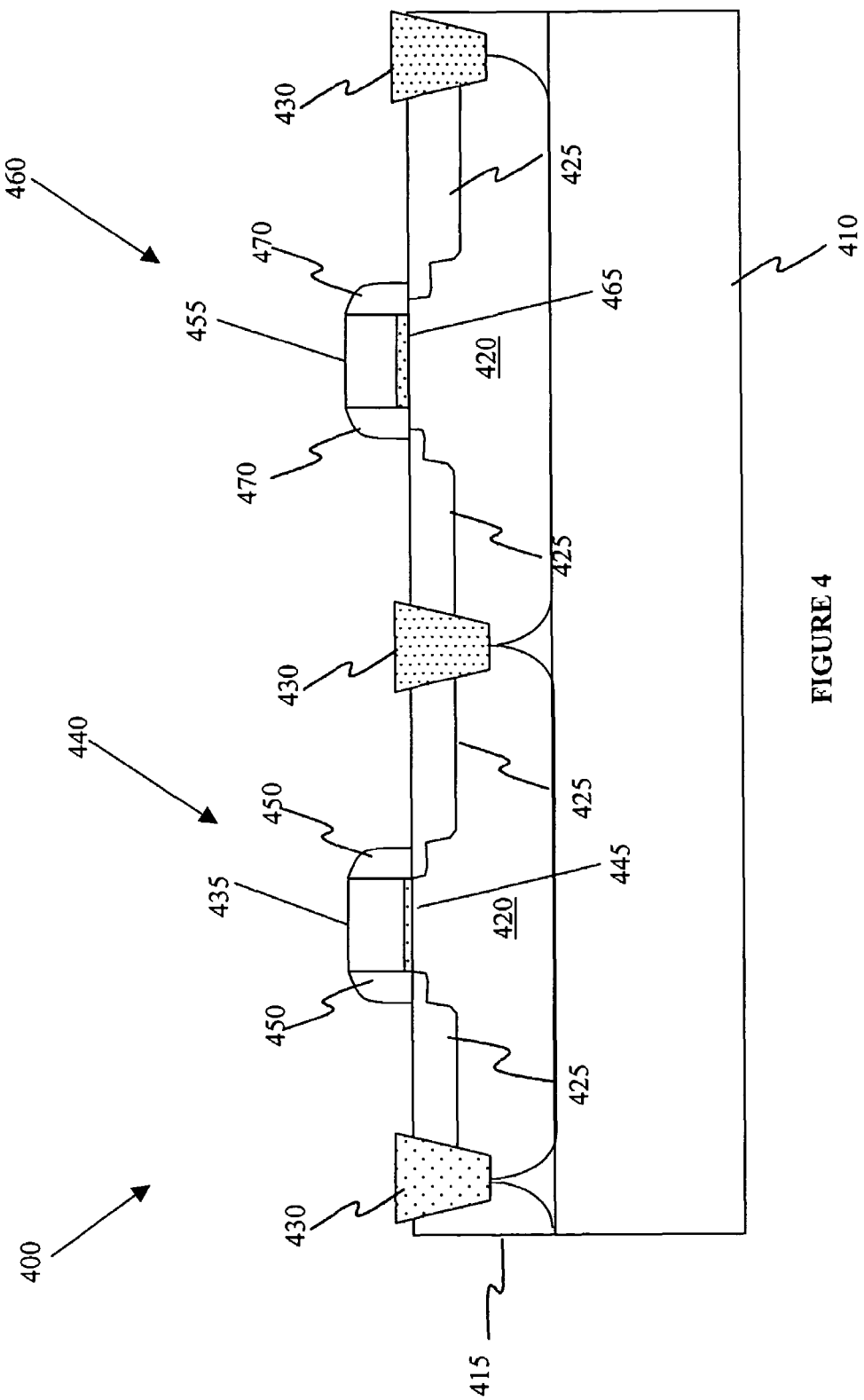
FIG. 4 illustrates a sectional view of the device shown in FIG. 3F after the conventional formation of dual gates.

Turning now to FIG. 4, there is illustrated a sectional view of the device shown in FIG. 3F after the conventional formation of dual gates. In the illustrated embodiment, the dual voltage device 400 includes a semiconductor substrate 410 over which is formed a tub or well layer 415 in which wells 420 and source/drain regions 425 are formed. The wells 420 are electrically isolated by conventionally formed isolation structures 430. A low voltage gate 435 is formed over a LV region 440 and is isolated from the well 420 using a nitridated, low voltage gate dielectric layer 445 formed in accordance with the present invention. The low voltage gate 435 also includes spacers 450. Shown adjacent the low voltage gate 435 for clarity is a high voltage gate 455 formed over a HV region 460 and is isolated from the well 420 using a nitridated, high voltage gate dielectric layer 465 formed in accordance with the present invention. The high voltage gate 455 also includes spacers 470. Also, the dual voltage device 400 may be also include metal silicide contact regions on the source/drain regions 425, which are not shown, and it may also be incorporated into an integrated circuit, as shown in FIG. 5.

Figure 5:
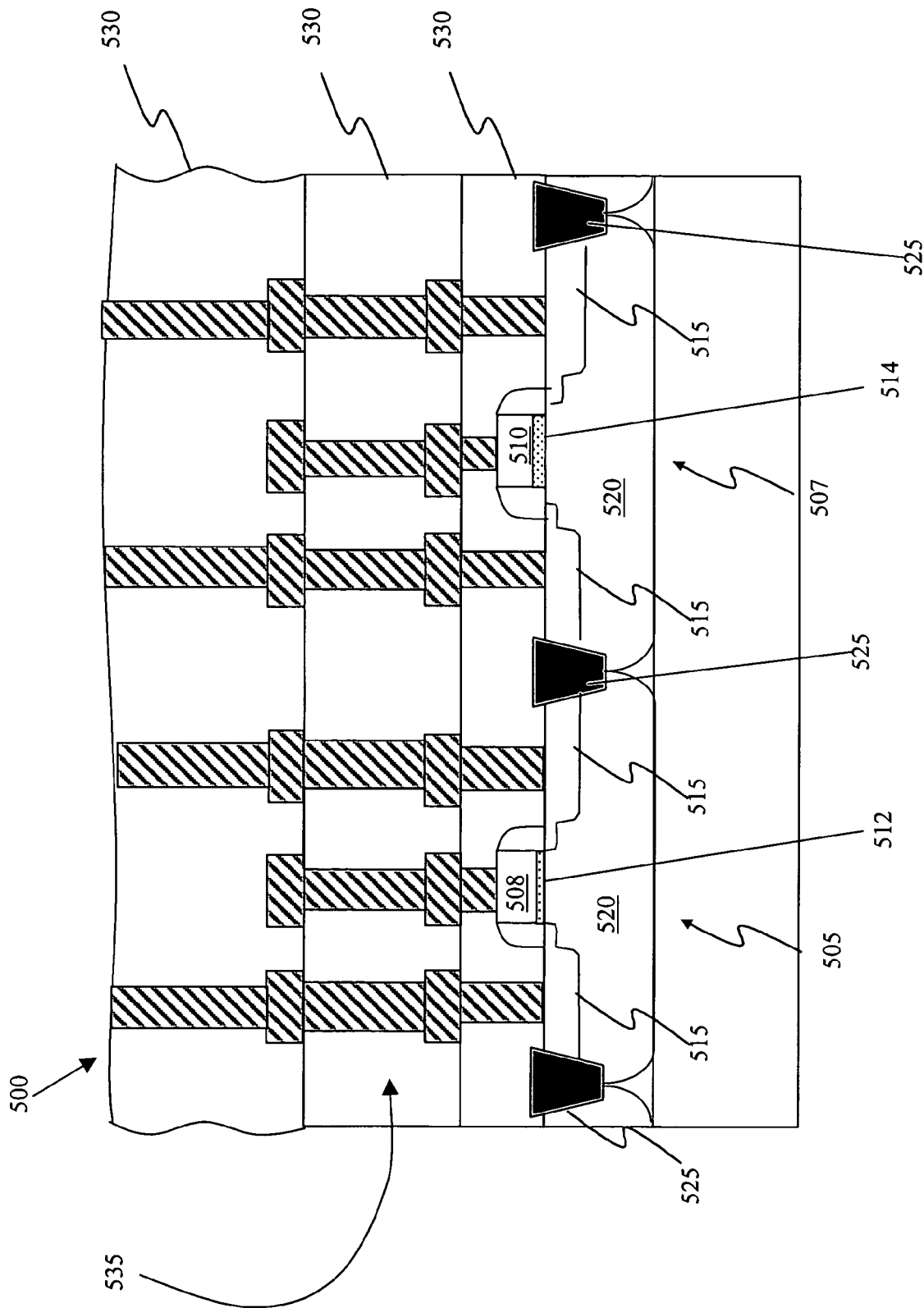
FIG. 5 illustrates a partial view of a dual voltage integrated circuit device that can be fabricated in accordance with the principles of the present invention.

FIG. 5 represents a partial view of a dual voltage integrated circuit device 500 that can be fabricated in accordance with the principles of the present invention. The integrated circuit 500 includes low voltage transistors 505 and high voltage transistors 507 that each respectively include a low voltage gate 508 and a high voltage gate 510. The gates 508 and 510 are designed to operate at their respective designed operating voltages. The low voltage gate 508 is electrically isolated by a nitridated, low voltage gate dielectric 512, and the high voltage gate 510 is electrically isolated by a nitridated, high voltage gate dielectric 514, both of which may be fabricated in accordance with the principles of the present invention.

The transistors 505 and 507 also each includes source/drains 515 formed in wells 520, which can be doped as desired. Conventional isolation structures 525 separate and electrically isolate the transistors 505 and 507 from each other. Interlevel dielectric layers 530 are located over the transistors 505 and 507 and interconnects 535 are formed therein to interconnect the various transistors 505 and 507 to form an operative integrated circuit. Given the teachings of present application, one who is skilled in the art would know how to form the operative integrated circuit as shown in FIG. 5.

Although the present invention has been described in detail, those skilled in the art should understand that they can make various changes, substitutions and alterations herein without departing from the spirit and scope of the invention in its broadest form.

What is claimed is:

1. A method for manufacturing a dual gate integrated circuit, comprising:
   forming a nitridated, high voltage gate dielectric layer over a semiconductor substrate;
   patterning a photoresist over said nitridated, high voltage gate dielectric layer to expose said nitridated, high voltage dielectric within a low voltage region, said patterning leaving an accelerant residue on said exposed nitridated, high voltage gate dielectric layer; and
   subjecting said exposed nitridated, high voltage dielectric to a high vacuum to remove said accelerant residue;
   forming a nitridated, low voltage gate dielectric layer over said semiconductor substrate within said low voltage regions;
   forming high voltage gate transistors over said nitridated, high voltage gate dielectric layer;
   forming low voltage gate transistors over said nitridated, low voltage gate dielectric layer;
   forming source/drain regions associated with each of said high voltage and low voltage transistors;
   forming dielectric layers located over said high voltage and low voltage transistors; and
   forming interconnects extending through said dielectric layers to interconnect said high voltage and low voltage transistors to form an operative integrated circuit.

2. The method as recited in claim 1 wherein said subjecting includes subjecting said exposed nitridated, high voltage dielectric to a vacuum ranging from about 1 $e^{-3}$ torr to about 1 $e^{-8}$ torr.

3. The method as recited in claim 2 wherein a temperature associated with said high vacuum ranges from about 20E C to about 5EC less than the $T_g$ of said photoresist.

4. The method as recited in claim 2 wherein said subjecting includes subjecting said exposed nitridated, high voltage dielectric to a vacuum of about 1 $e^{-6}$ torr.

5. The method as recited in claim 1 wherein said subjecting includes subjecting said exposed nitridated, high voltage dielectric to said high vacuum for a period of time ranging from about 2 minutes to about 60 minutes.

6. The method as recited in claim 5 wherein said time is about 10 minutes.

7. The method as recited in claim 1 wherein said accelerant residue acts as an accelerant for buffered hydrogen fluoride to increase a silicon etch rate of said buffered hydrogen fluoride.

8. The method as recited in claim 1 further including etching said nitridated, high voltage gate dielectric subsequent to said subjecting.

9. The method as recited in claim 1 further including forming a nitridated, low voltage gate dielectric over said low voltage region subsequent to subjecting said low voltage region to said plasma.

10. The method as recited in claim 1 wherein forming said nitridated, high voltage gate dielectric layer includes nitridating said high voltage gate dielectric layer using a decoupled nitridation process or a remote nitridation process.

11. The method as recited in claim 1 wherein said dielectric layer is silicon dioxide.

* * * * *